United States Patent [19]

Vossen, Jr. et al.

[11] 4,370,196

[45] Jan. 25, 1983

[54] ANISOTROPIC ETCHING OF ALUMINUM

[75] Inventors: John L. Vossen, Jr., Bridgewater, N.J.; Bernard Halon, Brooklyn, N.Y.

[73] Assignee: RCA Corporation, New York, N.Y.

[21] Appl. No.: 362,043

[22] Filed: Mar. 25, 1982

[51] Int. Cl.³ .............................................. C23F 1/02
[52] U.S. Cl. .................................. 156/643; 156/646;
156/656; 156/659.1; 156/665; 204/192 E;
252/79.1
[58] Field of Search .............. 252/79.1; 156/643, 656,
156/656, 659.1, 665; 204/164, 192 E, 298;
427/38, 39

[56] References Cited

U.S. PATENT DOCUMENTS 4,256,534 3/1981 Levinstein ......................... 156/643

FOREIGN PATENT DOCUMENTS 23146 1/1981 European Pat. Off. ............ 156/643
55-85670 6/1980 Japan ............................. 204/192 E
55-134173 10/1980 Japan ................................. 156/643

OTHER PUBLICATIONS

Vossen, *Pure & Applied Chemistry*, vol. 52, pp. 1759–1765 (1980).
Abstract No. 288 from *Electrochemical Society Extended Abstracts*, vol. 81 (2), pp. 703–705 (1981) by Bruce et al.

*Primary Examiner*—William A. Powell
*Attorney, Agent, or Firm*—Birgit E. Morris; R. Hain Swope

[57] ABSTRACT

A method of anisotropic etching of aluminum or an alloy thereof comprising using as the etch gas a mixture of boron trichloride, trichloromethane and hydrogen. The etchant mixture advantageously also contains nitrogen and helium.

8 Claims, No Drawings

ANISOTROPIC ETCHING OF ALUMINUM

This invention relates to the plasma etching of aluminum and its alloys. More particularly, this invention pertains to an improved etchant gas mixture for the plasma etching of aluminum.

BACKGROUND OF THE INVENTION

The importance of etching aluminum and its alloys has increased significantly within the last several years. As the electronics industry has moved into production of very large scale integrated circuits (VLSI), the need for methodology which meets the requirements of VLSI production has become increasingly acute.

The high-density, i.e. fine-line, geometries necessary for VLSI circuits make it essential that etching is anisotropic to achieve faithful delineation of patterns. This can be difficult with certain etchant gases such as those containing boron trichloride which can cause undercutting of the sidewalls of aluminum patterns with resulting loss of resolution.

A second problem encountered in the plasma etching of aluminum and its alloys is that most etchant gas mixtures tend to etch a substrate more rapidly at the periphery than the center. This nonuniformity of etch results in undercutting of the aluminum at the periphery over the time period required to assure complete etching of the center.

A further problem is the residues resulting from the plasma etching of aluminum. These residues, which may be formed from two sources, i.e. the photoresist and the etchant gas itself, are extremely tenacious and very difficult to remove by conventional procedures such as organic solvents or oxygen glow discharge.

In accordance with this invention, significant improvement has been achieved in all of these problem areas.

SUMMARY OF THE INVENTION

An etchant gas mixture for the anisotropic etching of aluminum or its alloys is provided which comprises boron trichloride, trichloromethane and hydrogen to which may be added nitrogen and helium.

DETAILED DESCRIPTION OF THE INVENTION

The etchant compositions of this invention will produce an anisotropic etch of aluminum or its alloys with only three components, i.e. boron trichloride, trichloromethane and hydrogen. For additional advantages as will become apparent, nitrogen and/or helium may also be added to the mixture.

Those skilled in the art are aware that etchant mixtures containing boron trichloride are disadvantageous in that they cause isotropic etching of the aluminum. This results in undercutting of the resist pattern and loss of resolution. In terms of VLSI production, significant undercutting cannot be tolerated.

It has been found in accordance with this invention that an anisotropic etch can be achieved with boron trichloride by adding thereto trichloromethane and hydrogen. Trichloromethane is, of course, an additional source of chlorine. More importantly, however, its presence causes the formation of a polymer under conditions of glow discharge. The polymer forms on the sidewalls of the etched aluminum and prevents sidewise etching, i.e. undercutting, of the resist pattern. The exact nature of the polymer is not known.

We have found that, in order for trichloromethane to be effective in preventing isotropic, i.e. sidewall etching, it is essential that the etchant mixture contains a small amount of hydrogen. The exact mechanism by which hydrogen functions in promoting polymer formation and anisotropic etching is uncertain.

In addition to the three gases found to be essential to anisotropic etching of aluminum in accordance with this invention, it is preferred that the subject etchant compositions contain helium. The function of helium is to stabilize the glow discharge and promote the integrity of the resist. The capacity of helium to so function is known to those skilled in the art.

It is further preferred that the subject etching compositions contain nitrogen. It is well known among those skilled in the art that a residue usually remains after plasma etching of aluminum. These residues are very tenacious and have resisted both physical and chemical means of removal. It has been found in accordance with this invention that the inclusion of an effective amount of nitrogen in the etching compositions of this invention either substantially eliminates these residues or sufficiently reduces their tenacity so that they can be removed by conventional procedures.

The mechanism whereby nitrogen functions in reducing the tenacity of the residues is not known with certainty. It is believed probable, however, that the nitrogen breaks the long polymeric chains which usually characterize such residues to form volatile products and/or shorter segments which can be removed by conventional procedures for the removal of organic or carbonaceous materials. By conventional procedures is meant the use of various solvents including highly polar organic solvents and/or exposing the surface to an oxygen glow discharge to "ash" or plasma etch the material away by the formation of, e.g. CO and $CO_2$. Without the inclusion of nitrogen in the subject compositions, these methods are ineffective. The residues could, however, be removed by nitrogen glow discharge as disclosed in our copending application, Ser. No. 362,042, filed concurrently herewith and incorporated herein by reference. In addition to its effect on the residues nitrogen acts to increase the etch rate. Above a certain concentration, however, nitrogen acts as a simple diluent for the subject etchant mixture, i.e. increasing the nitrogen content beyond that point decreases the etch rate.

The amounts of the various constituents of the etchant mixtures of this invention will vary over a wide range. Generally, the subject compositions contain, in percent by volume: from about 23 to about 83 percent, preferably from about 31 to about 53 percent, of boron trichloride; from about 11 to about 75 percent, preferably from about 11 to about 27 percent, of trichloromethane; from about 0.5 to about 9 percent, preferably from about 0.7 to about 2 percent, of hydrogen; from zero to about 55 percent, preferably from about 19 to about 36 percent, of nitrogen; and from zero to about 33 percent, preferably from about 15 to about 27 percent, of helium.

The above percentages are applied to conventional apparatus such as a planar reactor described in an article by J. L. Vossen, Jr. in Pure and Applied Chemistry, Vol. 52, pp. 1759–1765 (1981). In such reactors, the upper electrode can be powered to between 1 and 3 kW and the lower electrode tuned to about 230 volts with respect to ground. The total gas pressure utilized is typically 140–175 mtorr and total gas flow is from 40–100 sccm. None of these parameters is particularly critical.

It will be appreciated by those of ordinary skill in the art that the above parameters are given with reference to the system described in the Vossen article and that the geometry of a plasma system has an effect on its plasma potential. Therefore, the above parameters are variable depending on the type of system being utilized. For example, if the discharge were obstructed or constricted by using a smaller interelectrode separation or a smaller wall-electrode separation, the plasma potential would increase for a given pressure. This would increase the operating pressure and consequently, depending on the system geometry, the flow and pressure ranges yielding acceptable etching could be varied rather widely. The parameters for pressure, gas flow and the like which would be equivalent to those given above for variations in the plasma system utilized are considered to be within the skill of the art.

Again referring to the above percentages and parameters, the lower limit of boron trichloride and conversely, the upper limits of trichloromethane and hydrogen, represent the point at which polymer formation approaches the etch rate on planar surfaces and etching ceases. The opposite limits represent the point where isotropic etching becomes significant. Increasing the nitrogen concentration substantially beyond 55 percent by volume decreases the etch rate to a value of no practical consequence. In addition, increasing the nitrogen and/or the helium content substantially above their upper limits raises the pressure which leads to more isotropic etching. Finally, utilizing the system referred to above, a total flow substantially under 40 sccm materially restricts the composition content required to achieve an anisotropic etch. There is no apparent limit to using higher flows. In general, the best results are obtained with the highest gas flow and lowest total pressure possible with the equipment available.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

A series of one millimicron thick aluminum coated silicon wafers was utilized as substrates. The wafers were overcoated with a finely patterned resist layer. The wafers were placed in groups of three into a parallel electrode etching reactor. The upper electrode was rf powered and the lower (substrate) electrode was tuned to produce a voltage to ground of 238 volts. The upper electrode power was 2.35 kW and the pressure was 150 mtorr. The gas flow was 60 sccm. Etching was carried out using a mixture of, on a volume basis, 69 percent boron trichloride, 29 percent trichloromethane and 2 percent hydrogen. Etching was carried out for six minutes. Examination of the aluminum after removal of the resist showed the etch to be anisotropic with line width loss estimated to be less than one percent. The etching rate was between 1000–2000 angstroms per minute. The residue remaining after etching was completed was removed in accordance with copending application Ser. No. 362,042, by initially solubilizing it by nitrogen glow discharge followed by removal by oxygen glow discharge.

EXAMPLE 2

In the manner of Example 1, groups of two substrates were etched utilizing the following etching mixtures.

| Mixture | Percent by Volume | | | | |
| --- | --- | --- | --- | --- | --- |
|  | $BCl_3$ | $CHCl_3$ | $H_2$ | $N_2$ | He |
| A | 43 | 18.5 | 1.5 | 37 | 0 |
| B | 49 | 21 | 2 | 0 | 28 |
| C | 34 | 15 | 1 | 30 | 20 |

An anisotropic etch comparable to that achieved in Example 1 was achieved in each instance. In the instance of mixtures, A and C, the residue remaining after etching was completed was easily removed by oxygen plasma etch for five minutes. The residue from mixture B was removed in the same manner as in Example 1.

We claim:

1. A gaseous etchant composition for aluminum and its alloys comprising boron trichloride, trichloromethane and hydrogen.

2. An etchant composition in accordance with claim 1, wherein said composition additionally contains nitrogen, helium or mixtures thereof.

3. An etchant composition in accordance with claim 2, comprising, on a percent by volume basis: from about 23 to about 83 percent of boron trichloride; from about 15 to about 75 percent of trichloromethane; from about 0.5 to about 9 percent of hydrogen; from 0 to about 55 percent of nitrogen and from 0 to about 33 percent of helium.

4. An etchant composition in accordance with claim 1 wherein said composition comprises, on a percent by volume basis, about 69 percent of boron trichloride, about 29 percent of trichloromethane and about 2 percent of hydrogen.

5. An etchant composition in accordance with claim 3 wherein said composition comprises, on a percent by volume basis, from about 31 to about 53 percent of boron trichloride, from about 11 to about 27 percent of trichloromethane, from about 0.7 to about 2 percent of hydrogen, from about 19 to about 36 percent of nitrogen and from about 15 to about 27 percent of helium.

6. In a process of plasma etching aluminum or an alloy thereof, the improvement comprising utilizing as the etchant gas a mixture of boron trichloride, trichloromethane and hydrogen.

7. A process in accordance with claim 6, wherein said mixture also contains nitrogen, helium or mixtures thereof.

8. A process in accordance with claim 7, wherein said mixture contains both nitrogen and helium.

* * * * *